United States Patent
Nakatsuka et al.

(10) Patent No.: US 9,082,640 B2
(45) Date of Patent: Jul. 14, 2015

(54) PASS GATE AND SEMICONDUCTOR STORAGE DEVICE HAVING THE SAME

(71) Applicant: Kabushiki Kaisha Toshiba, Tokyo (JP)

(72) Inventors: Keisuke Nakatsuka, Kobe (JP); Shigeru Kawanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 87 days.

(21) Appl. No.: 13/779,358

(22) Filed: Feb. 27, 2013

(65) Prior Publication Data

US 2014/0061808 A1 Mar. 6, 2014

(30) Foreign Application Priority Data

Sep. 6, 2012 (JP) ................................. 2012-196366

(51) Int. Cl.
*H01L 27/088* (2006.01)
*H01L 27/11* (2006.01)
*H01L 27/02* (2006.01)
*G11C 11/412* (2006.01)
*H01L 29/739* (2006.01)

(52) U.S. Cl.
CPC ............ *H01L 27/088* (2013.01); *G11C 11/412* (2013.01); *H01L 27/0207* (2013.01); *H01L 27/1104* (2013.01); *H01L 29/7391* (2013.01)

(58) Field of Classification Search
CPC ... H01L 27/0203; H01L 27/088; H01L 27/11; H01L 27/1104; H01L 27/1116; H01L 29/7391
See application file for complete search history.

(56) References Cited

U.S. PATENT DOCUMENTS

| 6,052,304 | A * | 4/2000 | Chritz ...................... 365/185.08 |
| 6,310,798 | B1 | 10/2001 | Morimoto |
| 6,847,562 | B2 | 1/2005 | King |
| 7,012,842 | B2 | 3/2006 | King |
| 7,095,659 | B2 | 8/2006 | King |
| 7,821,815 | B2 | 10/2010 | Asayama |
| 2004/0001363 | A1 | 1/2004 | King |

(Continued)

FOREIGN PATENT DOCUMENTS

| JP | 2001-068632 A | 3/2001 |
| JP | 2005-531877 A | 10/2005 |

(Continued)

OTHER PUBLICATIONS

Japanese Office Action re Patent Application No. 2012-196366, mailed on Dec. 9, 2014.

*Primary Examiner* — Minh-Loan Tran
*Assistant Examiner* — Fazli Erdem
(74) *Attorney, Agent, or Firm* — Knobbe, Martens, Olson & Bear, LLP

(57) ABSTRACT

According to an embodiment, a semiconductor storage device includes an SRAM cell. The SRAM cell includes first and second transfer gates each comprising a pass gate. The pass gate includes first and second tunnel transistors. The first tunnel transistor includes a first conductivity type first diffusion region as a source or drain region, a second conductivity type second diffusion region as a drain or source region, and a gate electrode supplied with a control voltage. The second tunnel transistor includes a first conductivity type first diffusion region as a source or drain region, a second conductivity type second diffusion region as a drain or source region electrically connected to the second diffusion region of the first tunnel transistor, and a gate electrode electrically connected to the gate electrode of the first tunnel transistor.

19 Claims, 12 Drawing Sheets

(56) References Cited

U.S. PATENT DOCUMENTS

| | | |
|---|---|---|
| 2005/0128797 A1 | 6/2005 | King |
| 2006/0028881 A1 | 2/2006 | King |
| 2008/0068895 A1 | 3/2008 | Kakoschke et al. |
| 2012/0091537 A1* | 4/2012 | Adachi et al. ............... 257/392 |
| 2012/0326239 A1* | 12/2012 | Sasaki et al. ............... 257/369 |
| 2014/0091396 A1* | 4/2014 | Hokazono ............... 257/368 |

FOREIGN PATENT DOCUMENTS

| | | |
|---|---|---|
| JP | 2009-064482 A | 3/2009 |
| JP | 2012-084797 A | 4/2012 |

* cited by examiner

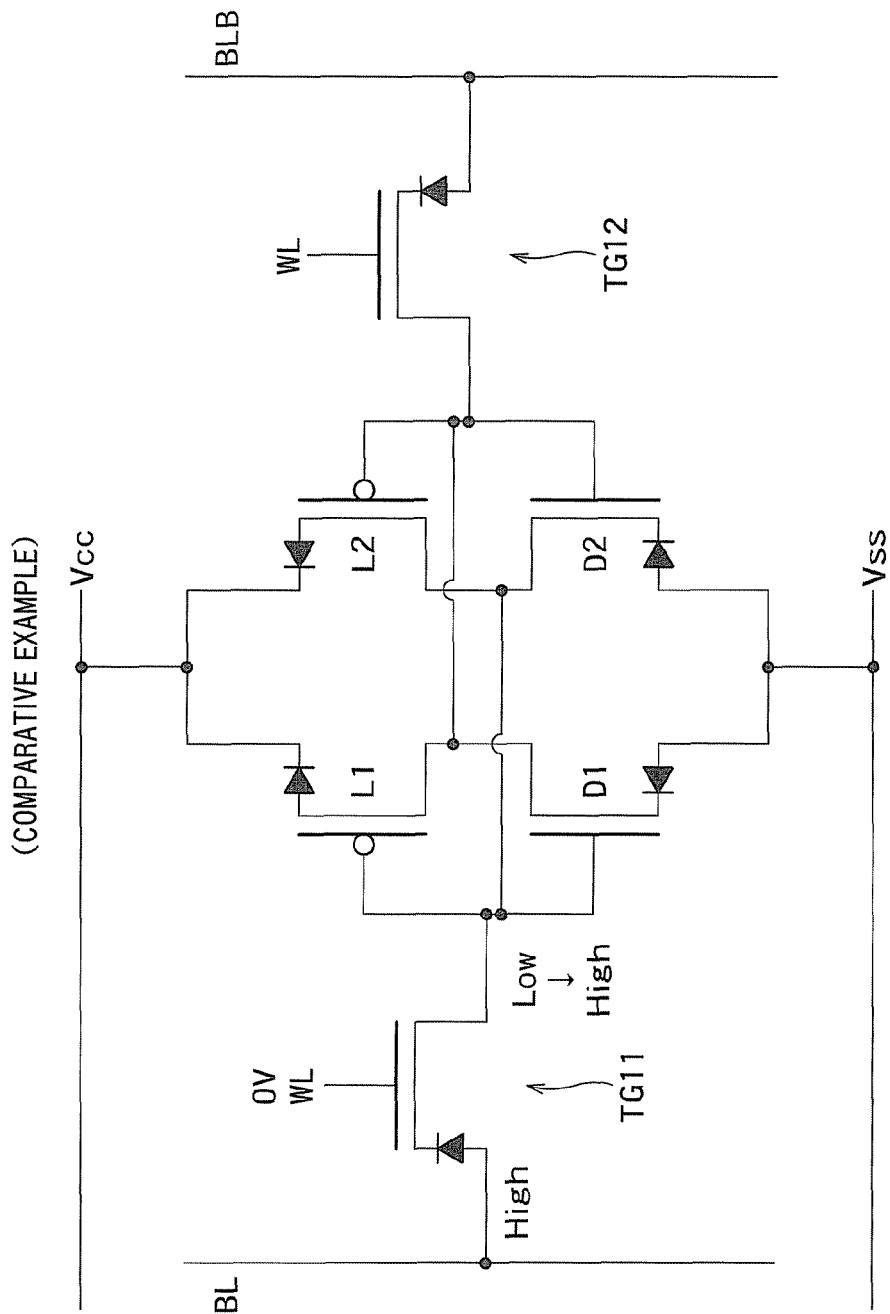
FIG. 13 (COMPARATIVE EXAMPLE)

US 9,082,640 B2

PASS GATE AND SEMICONDUCTOR STORAGE DEVICE HAVING THE SAME

CROSS REFERENCE TO RELATED APPLICATION

This application is based upon and claims the benefit of priority from the prior Japanese Patent Application No. 2012-196366 filed on Sep. 6, 2012 in Japan, the entire contents of which are incorporated herein by reference.

FIELD

Embodiments described herein relate generally to a pass gate and a semiconductor storage device having the same.

BACKGROUND

Recently, in an LSI formed on a silicon substrate, a performance of the LSI is enhanced by miniaturization of an element. When a MISFET (Metal Insulator Semiconductor Field Effect Transistor) is used, it becomes difficult to reduce a power supply voltage and to suppress a leakage current as miniaturization is progressed, and therefore it is difficult to realize an LSI whose power consumption is further reduced.

A three-terminal tunnel transistor controls a tunnel current of a p-n junction made between a drain and a source by a gate voltage. Since Id-Vg characteristics of the tunnel transistor change steeply as compared with a MISFET, the tunnel transistor is expected to reduce a power supply voltage and a power consumption.

In the tunnel transistor, a source and a drain have a different conductivity type, and in, for example, an N-type tunnel transistor, a source is a P-type and a drain is an N-type. Accordingly, the tunnel transistor has such characteristics that when a voltage between a gate and a source is zero, even if a positive voltage is applied to a drain on the basis of a source, a current can be cut off, whereas when the positive voltage is applied to the source on the basis of the drain, the current cannot be cut off.

Due to the characteristics described above, in a pass gate composed of one MISFET for controlling a bidirectional current, when the MISFET is replaced with a tunnel transistor as it is, the bidirectional current cannot be cut off.

BRIEF DESCRIPTION OF THE DRAWINGS

FIG. 13 is a circuit diagram of an SRAM cell of a comparative example.

DETAILED DESCRIPTION

According to an embodiment, a semiconductor storage device includes an SRAM cell formed to a semiconductor layer. The SRAM cell includes: first and second load transistors each comprising an N-type source region and a P-type drain region; first and second driver transistors each comprising a P-type source region and an N-type drain region; and first and second transfer gates each comprising a pass gate. The pass gate includes a first tunnel transistor and a second tunnel transistor. The first tunnel transistor includes a first conductivity type first diffusion region as a source or drain region, a second conductivity type second diffusion region as a drain or source region, and a gate electrode supplied with a control voltage. The second tunnel transistor includes a first conductivity type first diffusion region as a source or drain region, a second conductivity type second diffusion region as a drain or source region electrically connected to the second diffusion region of the first tunnel transistor, and a gate electrode electrically connected to the gate electrode of the first tunnel transistor. The first and second load transistors, and the first and second driver transistors are tunnel transistors.

Embodiments of the present invention will be explained below referring to drawings. These embodiments do not restrict the present invention.

First Embodiment

Figure 1:
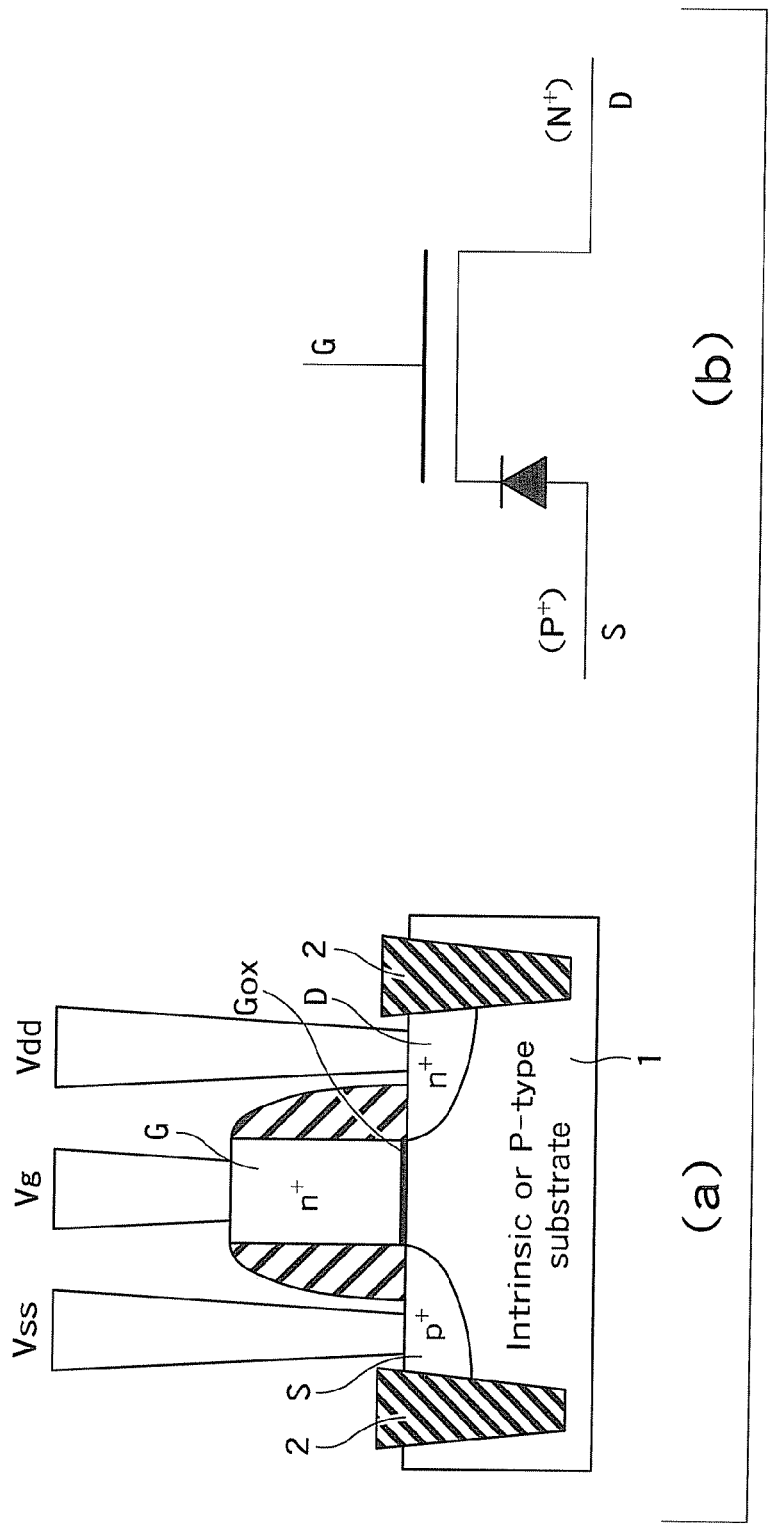
FIG. 1(a) is a sectional view illustrating a structure of an N-type tunnel transistor.
FIG. 1(b) is a view illustrating circuit symbols of the N-type tunnel transistor.

FIG. 1(a) is a sectional view illustrating a structure of an N-type tunnel transistor, and FIG. 1(b) is a view illustrating circuit symbols of the N-type tunnel transistor.

As illustrated in FIG. 1(a), the N-type tunnel transistor is disposed on a semiconductor substrate (semiconductor layer) 1 and has a P (P+) type source region S, an N (N+) type drain region D, a gate insulation film Gox, and a gate electrode G. As described above, the source region and the drain region of the tunnel transistor have a different conductivity type.

The semiconductor substrate 1 is composed of, for example, Si-type crystal such as Si crystal and is an intrinsic or P-type substrate. The P-type source region S and the N-type drain region D are disposed in a surface of the semiconductor substrate 1.

The gate insulation film Gox is disposed on a surface of the semiconductor substrate 1 between the P-type source region S and the N-type drain region D.

The gate electrode G is disposed on the gate insulation film Gox. The gate electrode G is composed of, for example, Si-type polycrystalline containing conductive impurities, metal or a laminated body thereof and is composed of, for example, an N (N+) type Si-type polycrystalline in an illustrated example.

A periphery of the tunnel transistor is surrounded by a device separation region 2. The device separation region 2 has, for example, a STI (Shallow Trench Isolation) structure and is buried with an insulation material such as $SiO_2$.

The tunnel transistor is a field-effect tunnel transistor (TFET) making use of interband tunneling in semiconductors.

In the embodiment, the tunnel transistor is shown by the circuit symbols having a symbol of a diode on the P-type source region S side as illustrated in FIG. 1(b).

Figure 2:
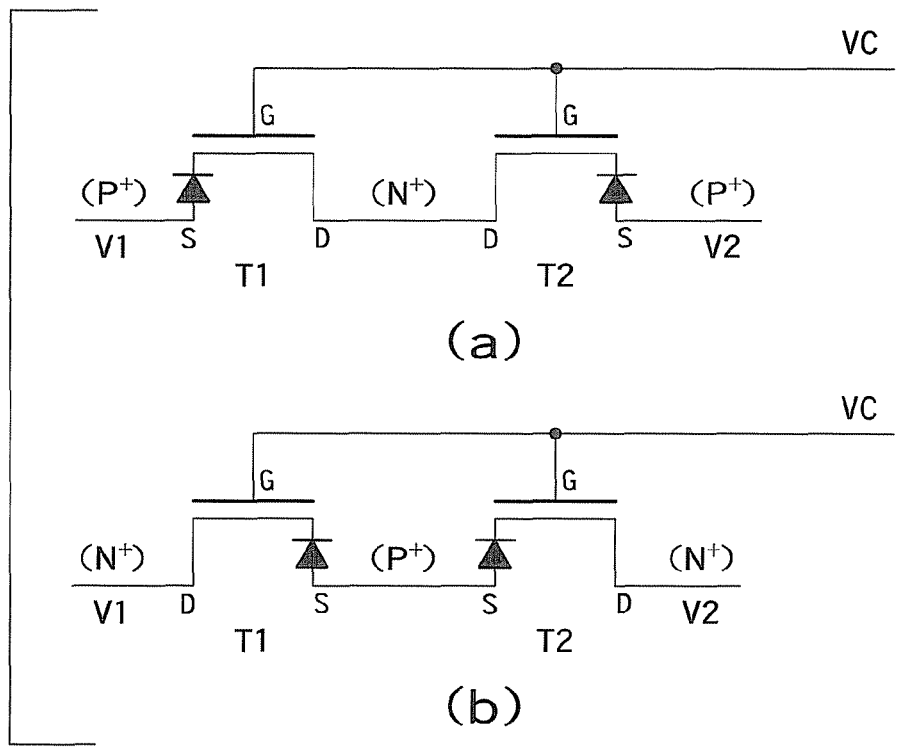
FIG. 2(a) is a circuit diagram of a pass gate according to a first embodiment.
FIG. 2(b) is a circuit diagram of other pass gate according to the first embodiment.

FIG. 2(a) is a circuit diagram of a pass gate according to the first embodiment, and FIG. 2(b) is a circuit diagram of other pass gate according to the first embodiment. As illustrated in FIG. 2(a) and FIG. 2(b), each of the pass gates includes a first tunnel transistor T1 and a second tunnel transistor T2. The first and second tunnel transistors T1 and T2 are the N-type tunnel transistors explained in FIG. 1(a) and FIG. 1(b).

First, the pass gate of FIG. 2(a) will be explained.

The first tunnel transistor T1 has a P-type source region (first conductivity type first diffusion region) S, an N-type drain region (second conductivity type second diffusion region) D, and a gate electrode G supplied with a control voltage VC.

The second tunnel transistor T2 has a P-type source region S, an N-type drain region D electrically connected to the N-type drain region D of the first tunnel transistor T1, and a gate electrode G electrically connected to the gate electrode G of the first tunnel transistor T1.

A voltage of the P-type source region S of the first tunnel transistor T1 is set to a voltage V1, and a voltage of the P-type source region S of the second tunnel transistor T2 is set to a voltage V2.

When the pass gate is turned off, a current does not flow because any of the first and second tunnel transistors T1 and T2 cuts off the current. When, for example, the control voltage VC and the voltage V1 are a ground voltage and the voltage V2 is a positive voltage, a diode between the N-type drain region D and the P-type source region S of the first tunnel transistor T1 is biased in a reverse direction, and therefore the first tunnel transistor T1 cuts off the current. Further, when the control voltage VC and the voltage V2 are the ground voltage and the voltage V1 is the positive voltage, a diode between the N-type drain region D and the P-type source region S of the second tunnel transistor T2 is biased in the reverse direction, and therefore the second tunnel transistor T2 cuts off the current.

When the pass gate is turned on, since any one of the first and second tunnel transistors T1 and T2 operates as a transistor and the diode of the other tunnel transistor is biased in a forward direction, the current flows.

When, for example, the voltage V1 is the ground voltage and the control voltage VC and the voltage V2 are the positive voltage, a tunnel current flows in the first tunnel transistor T1 and the diode between the N-type drain region D and the P-type source region S of the second tunnel transistor T2 is biased in the forward direction, and therefore the current flows to the pass gate. Further, when the voltage V2 is the ground voltage and the control voltage VC and the voltage V1 are the positive voltage, the tunnel current flows in the second tunnel transistor T2 and the diode between the N-type drain region D and the P-type source region S of the first tunnel transistor T1 is biased in the forward direction, and therefore the current flows to the pass gate.

As illustrated in FIG. 2(b), when P-type source regions S of first and second tunnel transistors T1 and T2 are connected to each other, the same operation as FIG. 2(a) is performed.

That is, the first tunnel transistor T1 has an N-type drain region (first conductivity type first diffusion region) D, the P-type source region (second conductivity type second diffusion region) S and a gate electrode G supplied with the control voltage VC.

The second tunnel transistor 12 has an N-type drain region D, the P-type source region S electrically connected to the P-type source region S of the first tunnel transistor T1, and a gate electrode G electrically connected to the gate electrode G of the first tunnel transistor T1.

A voltage of the N-type drain region D of the first tunnel transistor T1 is set to the voltage V1, and voltage of the N-type drain region D of the second tunnel transistor T2 is set to the voltage V2.

However, different from a MISFET in which on/off is determined by a potential difference between a gate and a substrate, in the first and second tunnel transistors T1 and T2, on/off is determined by a potential difference (Vgs) between the gate and the source. Accordingly, to certainly perform turn on, a potential of the source region S is preferably the ground voltage (ground). That is, as illustrated in FIG. 1(a), it is preferable that the N-type drain regions D and D are connected to each other and the ground voltage can be supplied to the P-type source region S.

As described above, according to the embodiment, since the source regions S and S or the drain regions D and D of the first and second tunnel transistors T1 and T2, that is, the diffusion regions having the same conductivity type are electrically connected to each other, when the pass gate is turned off, even if any of the voltages V1 and V2 is higher, the current does not flow because the diode of one of the tunnel transistors is biased in the reverse direction. Accordingly, the current in a bidirectional direction can be certainly cut off. Further, when the pass gate is turned on, even if any of the voltages V1 and V2 is higher, the current can be caused to flow in the bidirectional direction because one of the tunnel transistors causes the tunnel current to flow as well as the diode of the other tunnel transistor is biased in the forward direction.

Accordingly, in the pass gate using the tunnel transistor, cut off characteristics similar to those of a pass gate of a MISFET can be obtained by improving the cut off characteristics.

Further, in a semiconductor device provided with a pass gate, since the tunnel transistor can be used as all transistors, a production cost and a power consumption can be reduced.

Modification of First Embodiment

Even if a P-type tunnel transistor is used, a pass gate can be configured likewise the first embodiment.

Figure 3:
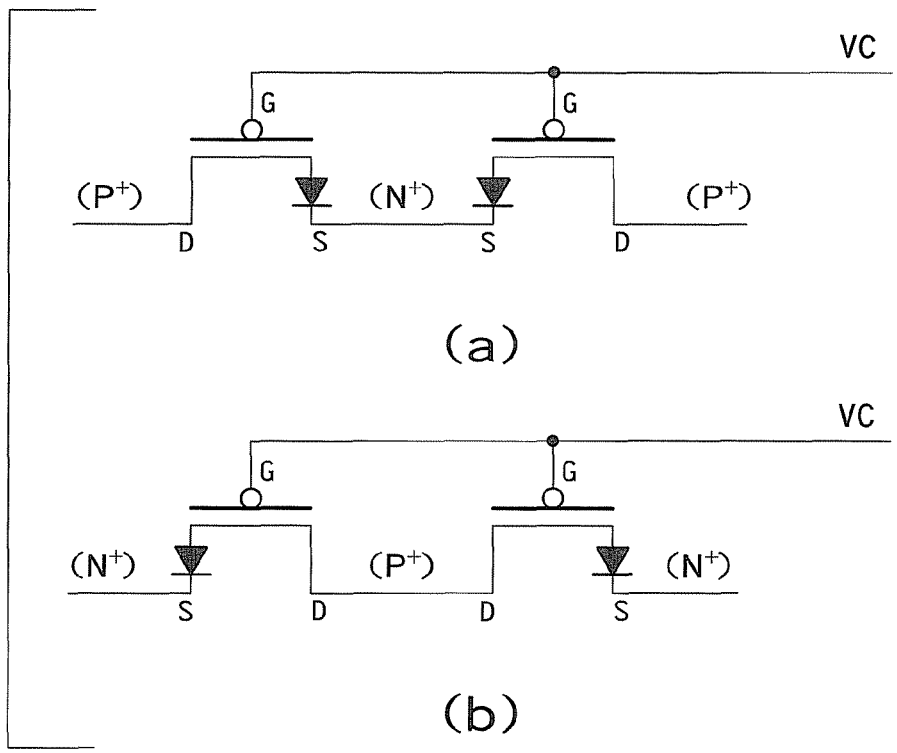
FIG. 3(a) is a circuit diagram of a pass gate according to a modification of the first embodiment.
FIG. 3(b) is a circuit diagram of other pass gate according to the modification of the first embodiment.

FIG. 3(a) is a circuit diagram of a pass gate according to a modification of the first embodiment, and FIG. 3(b) is a circuit diagram of other pass gate according to the modification of the first embodiment.

In the pass gate of FIG. 3(a), a first tunnel transistor T1 has a P-type drain region (first conductivity type first diffusion region) D, an N-type source region (second conductivity type second diffusion region) S, and a gate electrode G supplied with a control voltage VC.

The second tunnel transistor T2 has a P-type drain region D, an N-type source region S electrically connected to the N-type source region S of the first tunnel transistor T1, and a gate electrode G electrically connected to the gate electrode G of the first tunnel transistor T1.

In the pass gate of FIG. 3(b), a first tunnel transistor T1 has an N-type source region (first conductivity type first diffusion region) S, a P-type drain region (second conductivity type second diffusion region) D, and a gate electrode G supplied with the control voltage VC.

The second tunnel transistor T2 has an N-type source region S, a P-type drain region D electrically connected to the P-type drain region D of the first tunnel transistor T1, and a gate electrode G electrically connected to the gate electrode G of the first tunnel transistor T1.

These pass gates can also certainly cut off a current in a bidirectional direction by an operating principle similar to the pass gate of FIG. 2(a) and FIG. 2(b).

Second Embodiment

A second embodiment relates to an SRAM (Static Random Access Memory) including the pass gate of the first embodiment.

Figure 4:
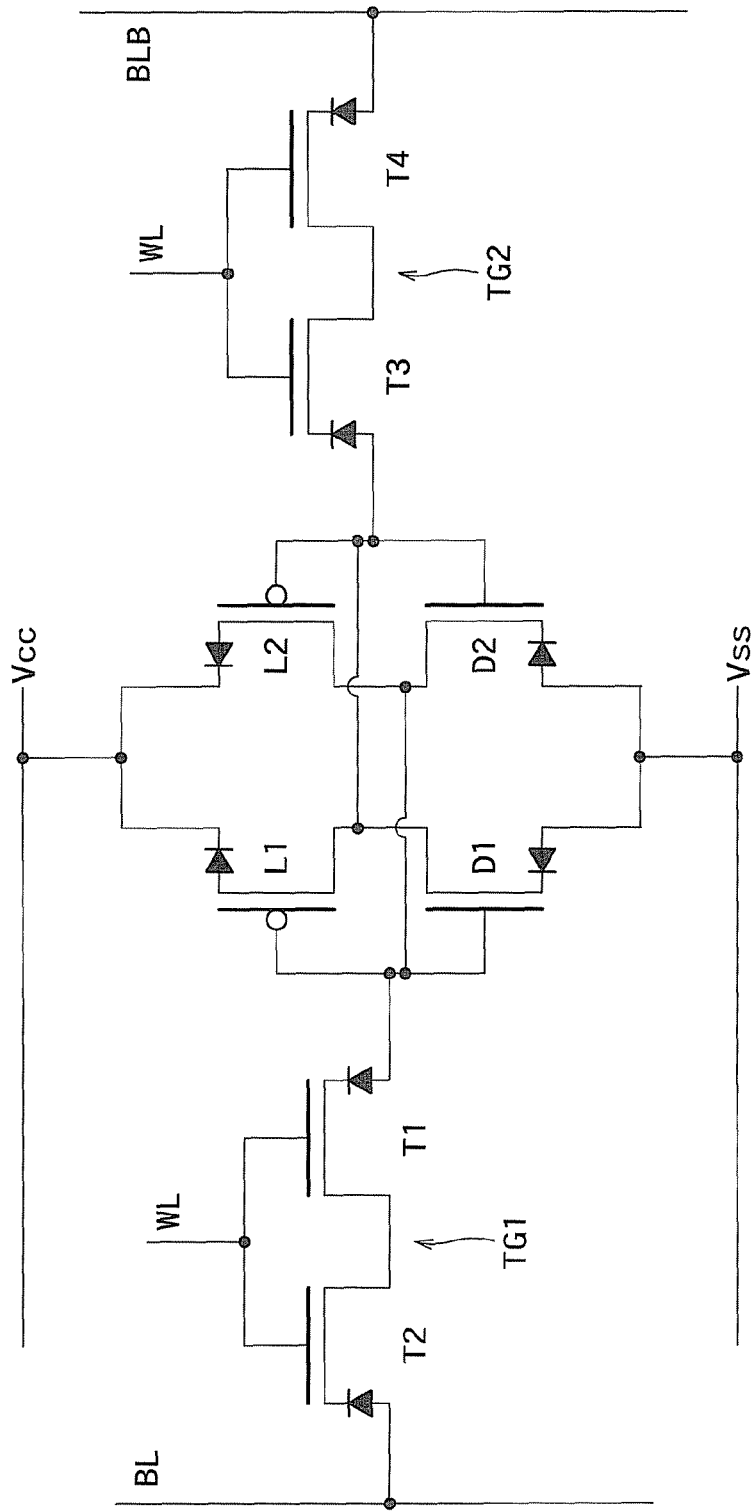
FIG. 4 is a circuit diagram of an SRAM cell of a semiconductor storage device according to a second embodiment.

FIG. 4 is a circuit diagram of an SRAM cell 5 of a semiconductor storage device according to the second embodiment.

The semiconductor storage device of the second embodiment is an eight-transistor type SRAM. The SRAM has plural SRAM cells 5 disposed in a matrix state. As illustrated in FIG. 4, each of the SRAM cells 5 has first and second P-type load transistors L1 and L2, first and second N-type driver transistors D1 and D2, and first and second transfer gates TG1 and TG2.

Each of the first and second transfer gates TG1 and TG2 is composed of the pass gate of FIG. 1(a) of the first embodiment. The first and second driver transistors D1 and D2 as well as the first and second load transistors L1 and L2 are the tunnel transistors explained in the first embodiment. A detailed circuit connection will be described later referring to a layout.

A word line WL is connected to gate electrodes of first and second tunnel transistors T1 and T2 of the first transfer gate TG1 and to gate electrodes of first and second tunnel transistors T3 and T4 of the second transfer gate TG2. When a ground voltage is supplied to the word line WL, even if any of a voltage of a bit line BL and a gate voltage of the first load transistor L1 is higher, the first transfer gate TG1 certainly cuts off a current. Likewise, the second transfer gate TG2 also certainly cuts off the current. Accordingly, the SRAM of the second embodiment can prevent an erroneous write.

Figure 5:
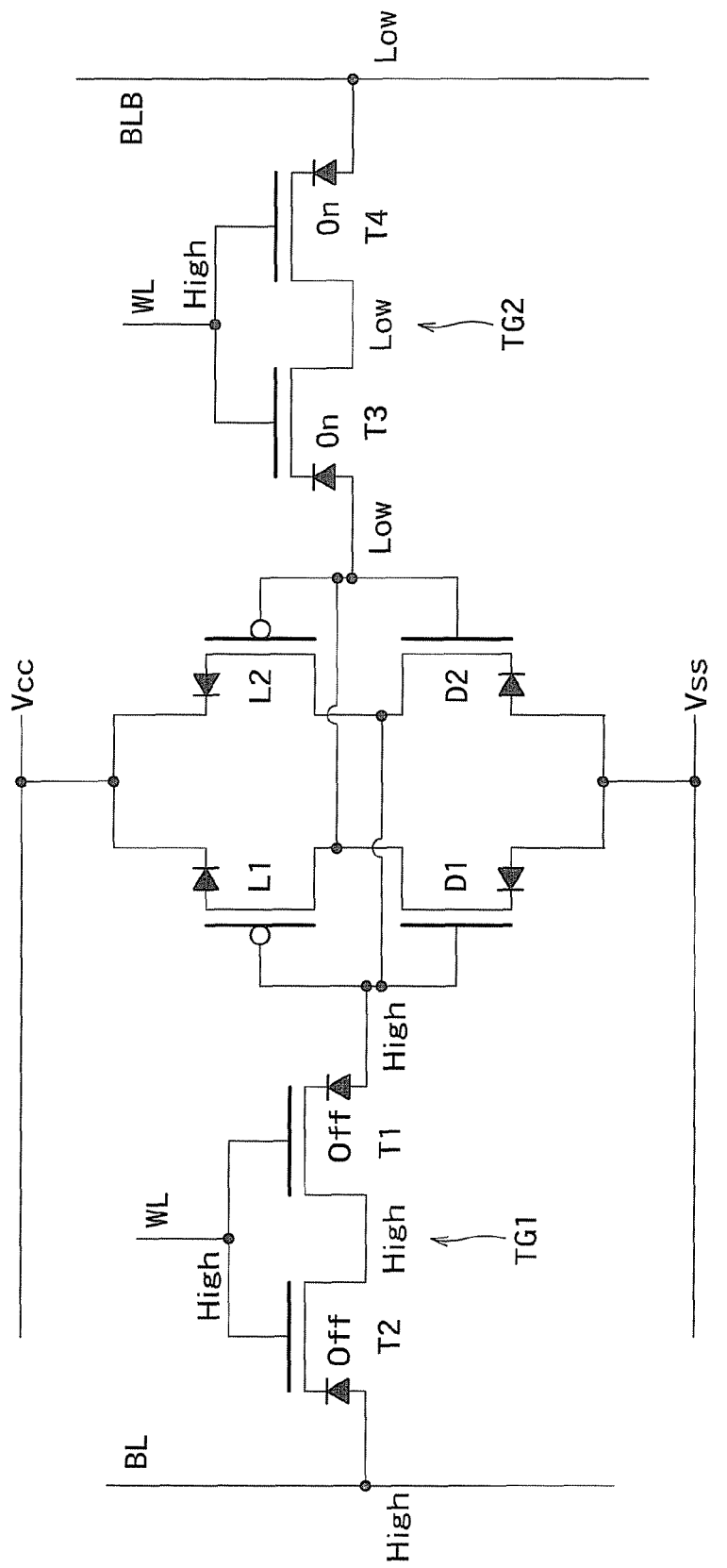
FIG. 5 is a view illustrating an example of voltages of respective sections at the time of read-out in the SRAM cell of FIG. 4.

FIG. 5 is a view illustrating an example of voltages of respective sections at the time of read-out in the SRAM cell of FIG. 4.

Due to the characteristics of the tunnel transistor that "on/off is determined by Vgs" which is explained in the first embodiment, when it is taken into consideration that data is read in the SRAM, if a high voltage of the word line WL is equal to a power supply voltage Vcc, the transfer gate TG1 on a side where data (the gate voltage of the first load transistor L1) is high is turned off. Accordingly, the read data is likely inverted. This means that a fear of Read Disturb increases. To avoid this, it is effective to boost a power supply voltage Vcc so that a voltage higher than the power supply voltage Vcc is supplied to the word line WL. With the operation, the transfer gate TG1 or TG2 on the side where the data is high is certainly turned on.

Next, a layout of the SRAM cell 5 will be explained referring to FIG. 6(a), FIG. 6(b), FIG. 6(c), FIG. 7(a), FIG. 7(b), and FIG. 7(c). Although various layouts can be conceived to reduce a foot print area, an example will be explained here.

Figure 6:
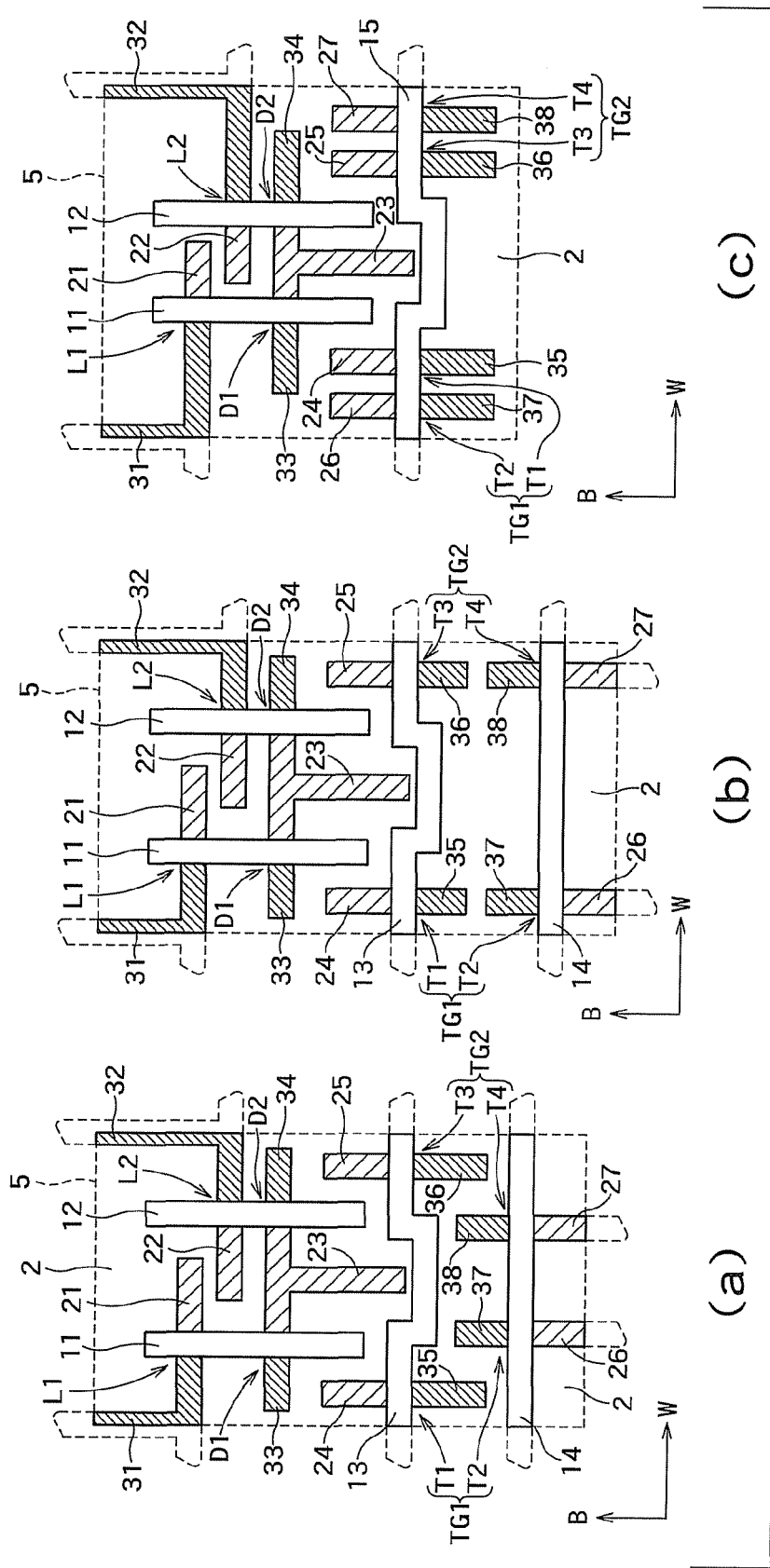
FIG. 6(a), FIG. 6(b), and FIG. 6(c) are views briefly illustrating layouts of the SRAM cell of FIG. 4.
Figure 7:
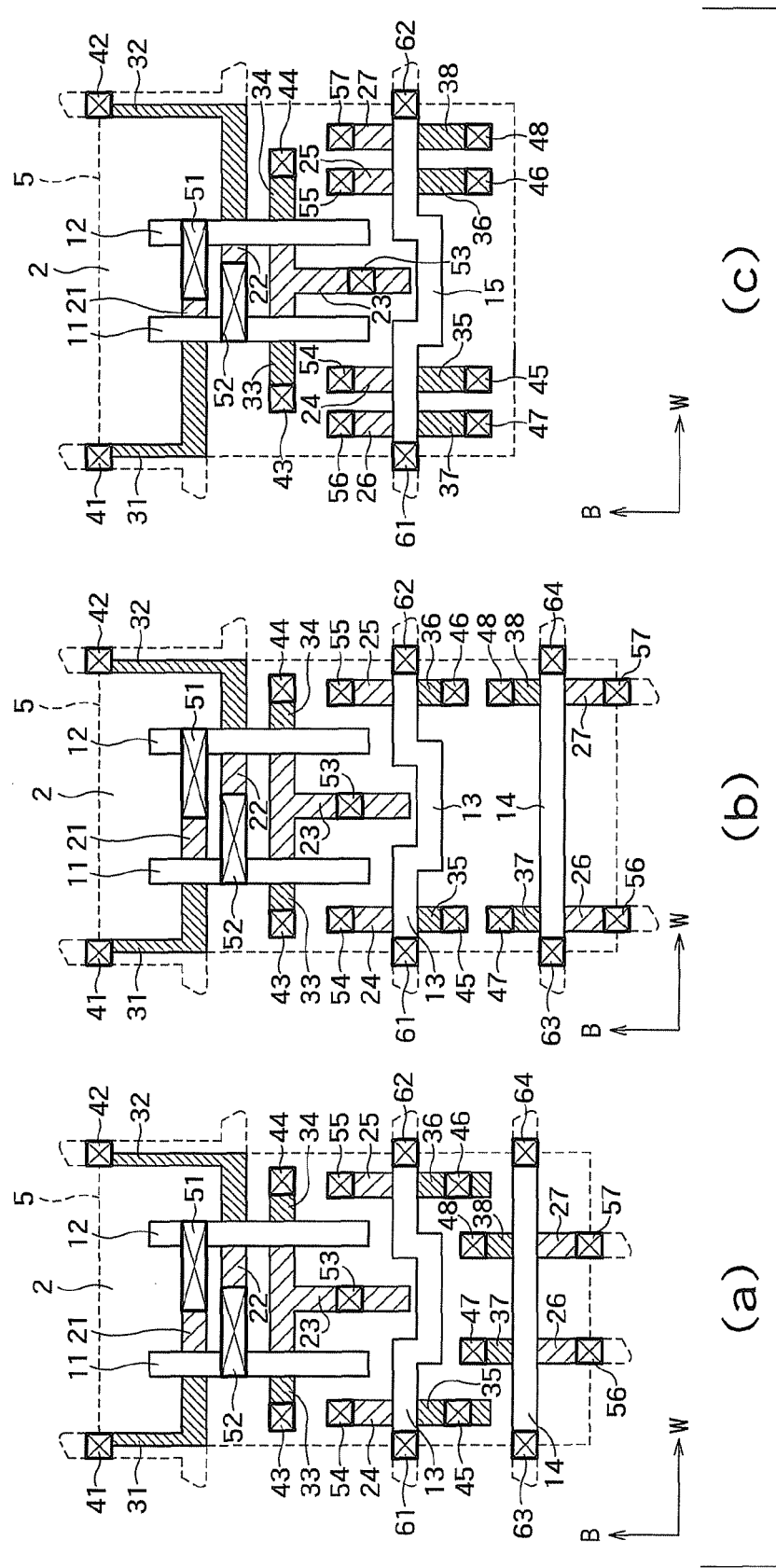
FIG. 7(a), FIG. 7(b), and FIG. 7(c) are views where contact plugs are also illustrated to the layouts of FIG. 6(a), FIG. 6(b), and FIG. 6(c), respectively.

FIG. 6(a) to FIG. 6(c) are views briefly illustrating layouts of the SRAM cell 5 of FIG. 4. In FIG. 6(a) to FIG. 6(c), the first and second transfer gates TG1 and TG2 have different layouts from each other. FIG. 7(a) to FIG. 7(c) are views where contact plugs are also illustrated to the layouts of FIG. 6(a) to FIG. 6(c), respectively.

First, FIG. 6(a) and FIG. 7(a) will be explained. A W-direction and a B-direction in the drawings show a length direction of a word line and a length direction of a bit line, respectively.

The first load transistor L1 has an N-type source region 31 and a P-type drain region 21. Further, the second load transistor L2 has an N-type source region 32 and a P-type drain region 22.

The first driver transistor D1 has a P-type source region 23 and an N-type drain region 33. Further, the second driver transistor D2 has a P-type source region 23 and an N-type drain region 34.

The first tunnel transistor T1 of the first transfer gate TG1 has a P-type source region 24 and an N-type drain region 35. The second tunnel transistor T2 of the first transfer gate TG1 has a P-type source region 26 and an N-type drain region 37.

The first tunnel transistor T3 of the second transfer gate TG2 has a P-type source region 25 and an N-type drain region 36. The second tunnel transistor T4 of the second transfer gate TG2 has a P-type source region 27 and an N-type drain region 38.

The P-type drain regions 21 and 22, the P-type source regions 23, 24, 25, 26, and 27, the N-type source regions 31 and 32, and the N-type drain regions 33, 34, 35, 36, 37, and 38 are formed in an active region which is a region on a semiconductor substrate 1 partitioned by a device separation region 2.

A gate electrode (first shared gate electrode) 11 is shared by the first load transistor L1 and the first driver transistor D1. A gate electrode (second shared-gate electrode) 12 is shared by the second load transistor L2 and the second driver transistor D2.

A gate electrode of the first tunnel transistor T1 of the first transfer gate TG1 and a gate electrode of the first tunnel transistor T3 of the second transfer gate TG2 are formed integrally and configured as a gate electrode (third shared gate electrode) 13 extending in the W-direction.

A gate electrode of the second tunnel transistor T2 of the first transfer gate TG1 and a gate electrode of the second tunnel transistor T4 of the second transfer gate TG2 are formed integrally and configured as a gate electrode (fourth shared gate electrode) 14 extending in the W-direction.

The gate electrodes 11 to 14 are configured as explained in the first embodiment.

As illustrated in FIG. 7(a), contact plugs 41 and 42 are connected to N-type source regions 31 and 32, respectively. Contact plugs 43, 44, 45, 46, 47, and 48 are connected to N-type drain regions 33, 34, 35, 36, 37, and 38, respectively. Contact plugs 53, 54, 55, 56, and 57 are connected to P-type source regions 23, 24, 25, 26, and 27, respectively. Further, shared contact plugs 51 and 52 are connected to P-type drain regions 21 and 22, respectively.

The contact plugs 41 to 48, 53 to 57, and the shared contact plugs 51 and 52 are composed of metal such as W.

The N-type source regions 31 and 32 are applied with the power supply voltage (Vcc) via the contact plugs 41 and 42. The P-type source region 23 is applied with a reference power supply voltage (Vss) such as a ground voltage via the contact plug 53.

Each of the P-type source regions 26 and 27 is connected with the bit line BL or a bit line BLB (not illustrated) via the contact plugs 56 or 57. The gate electrodes 13 and 14 are connected with the word line WL (not illustrated) which intersects the bit lines BL and BLB, via contact plugs 61 to 64.

The contact plugs 43 and 54 are connected to the shared contact plug 51 via a wiring (not illustrated) of an upper layer and the gate electrode 12, the P-type drain region 21, the N-type drain region 33, and the P-type source region 24 are electrically connected to each other.

Further, the contact plugs 44 and 55 are connected to the shared contact plug 52 via other wiring (not illustrated) of the upper layer, and the gate electrode 11, the P-type drain region 22, the N-type drain region 34, and the P-type source region 25 are electrically connected to each other.

The contact plugs 45 and 47 are connected via a wiring (not illustrated) of the upper layer, and N-type drain regions 35 and 37 are electrically connected to each other.

The contact plugs 46 and 48 are connected via a wiring (not illustrated) of the upper layer, and the N-type drain regions 36 and 38 are electrically connected to each other.

In the SRAM cell 5 of the second embodiment, the first and second load transistors L1 and L2 do not share one active region, and the P-type drain regions 21 and 22 are disposed adjacent to each other across the device separation region 2. Accordingly, the P-type drain regions 21 and 22, and the P-type source region 23 are disposed together.

Note that the first and second load transistors L1 and L2 share an active region with a load transistor of other SRAM cell adjacent thereto in the W-direction of the SRAM cell 5, respectively.

That is, the N-type source region 31 and 32 of the first and second load transistors L1 and L2, as well as the N-type drain regions 33 and 34 of the first and second driver transistors D1 and D2 are disposed in a region other than a region between any two of the P-type drain regions 21 and 22 of the first and second load transistors L1 and L2, as well as the P-type source region 23 of the first and second driver transistors D1 and D2.

Further, the N-type drain regions 35 to 38 of the first and second transfer gate TG1 and TG2 are disposed together. That is, the four P-type source regions 24 to 27 of the first and second transfer gates TG1 and TG2 are disposed in a region other than a region between any two of the four N-type drain regions 35 to 38 of the first and second transfer gates TG1 and TG2.

Further, the P-type source regions 24 and 25 of the first and second transfer gates TG1 and TG2 are also disposed together with the P-type drain regions 21 and 22 and the P-type source region 23.

Accordingly, since a pattern of a mask used to an ion implantation for forming these impurity diffusion regions does not become complex, a lithography can be relatively easily performed. Further, since resolution of the lithography can be easy, there is a less possibility of occurrence of fluctuation in an edge section of a pattern. Accordingly, a dispersion of transistor characteristics can be suppressed.

Next, FIG. 6(b) and FIG. 7(b) will be explained.

In the first transfer gate TG1, the P-type source region 24 and the N-type drain region 35 of the first tunnel transistor T1 and the N-type drain region 37 and the P-type source region 26 of the second tunnel transistor 12 are disposed in this order along the B-direction.

In the second transfer gate TG2, the P-type source region 25 and the N-type drain region 36 of the first tunnel transistor T3 and the N-type drain region 38 and the P-type source region 27 of the second tunnel transistor T4 are disposed in this order along the B-direction as well as approximately in parallel with the P-type source regions 24 and 26 and the N-type drain regions 35 and 37 of the first and second tunnel transistors T1 and T2.

In the example, a size of the SRAM cell 5 is made larger in the B-direction as compared with FIG. 6(a). However, an interval between the N-type drain region 35 and the N-type drain region 37 can be made as wide as necessary to separate a well.

Next, FIG. 6(c) and FIG. 7(c) will be explained.

Gate electrodes of the first and second transfer gates TG1 and TG2 are formed integrally and configured as a gate electrode (third shared gate electrode) 15 extending in the W-direction.

The two P-type source regions 24 and 26 of the first transfer gate TG1 are disposed adjacent to each other across the device separation region 2 as well as disposed on one side of the gate electrode 15. The two N-type drain regions 35 and 37 of the first transfer gate TG1 are disposed adjacent to each other across the device separation region 2 as well as disposed on the other side of the gate electrode 15.

The two P-type source regions 25 and 27 of the second transfer gate TG2 are disposed adjacent to each other across the device separation region 2 as well as disposed on the one side of the gate electrode 15. The two N-type drain regions 36 and 38 of the second transfer gate TG2 are disposed adjacent to each other across the device separation region 2 as well as disposed on the other side of the gate electrode 15.

In the example, a number of gate electrodes can be reduced, and a size of the SRAM cell 5 in the B-direction can be reduced. Further, the P-type drain regions 21 and 22 and the P-type source region 23 to 27 are disposed together.

As described above, according to the second embodiment, since the transfer gates TG1 and TG2 of the SRAM cell 5 are composed of the pass gate of the first embodiment, even if a tunnel transistor is used as all transistors of the SRAM cell 5, an occurrence of an erroneous write can be prevented. Accordingly, a production cost and a power consumption can be reduced.

Comparative Example

Here, an SRAM cell of a comparative example of which the inventors can be aware will be explained.

FIG. 13 is a circuit diagram of the SRAM cell of the comparative example. In the SRAM cell, all MISFETs of an existing 6-transistor type SRAM cell are replaced with tunnel transistors. That is, each of transfer gates TG11 and TG12 is composed of one tunnel transistor.

In the SRAM cell, when a gate voltage of a load transistor L1 and a driver transistor D1 is low and a voltage of a bit line BL becomes high, a current flows from a P-type source region to an N-type drain region of the transfer gate TG11 whose word line WL has a voltage of 0V and which is not selected. As a result, the gate voltage of the load transistor L1 and the driver transistor D1 changes from low to high. That is, an erroneous write occurs.

Accordingly, it is necessary to use a MISFET, which is certainly turned off when the voltage of the word line WL is 0V, as the transfer gates TG11 and TG12. In the case, since tunnel transistors and MISFETs are used at the same time, a production cost and a power consumption are higher than the second embodiment.

Third Embodiment

A third embodiment is different from the second embodiment in the point that each of first and second transfer gates TG1 and TG2 is composed of the pass gate of FIG. 1(b) of the first embodiment.

Figure 8:
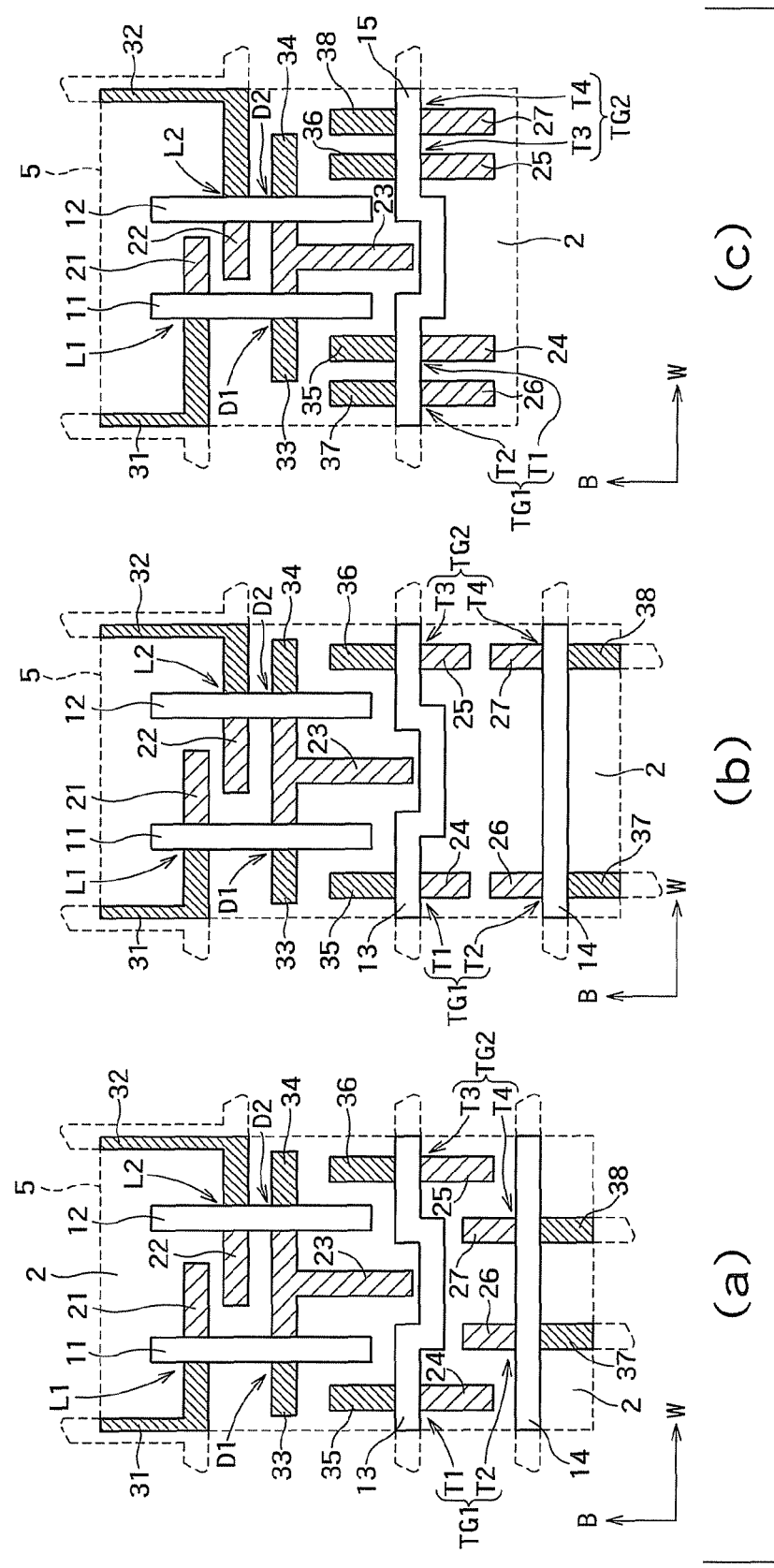
FIG. 8(a), FIG. 8(b), and FIG. 8(c) are views schematically illustrating a layout of an SRAM cell according to a third embodiment.

FIG. 8(a), FIG. 8(b), and FIG. 8(c) are views schematically illustrating a layout of an SRAM cell 5 according to the third embodiment. FIG. 8(a), FIG. 8(b), and FIG. 8(c) are different from each other in layouts of first and second transfer gates TG1 and TG2, and correspond to FIG. 6(a) to FIG. 6(c), respectively. In FIG. 8(a) to FIG. 8(c), components common to those of FIG. 6(a) to FIG. 6(c) are denoted by the same reference numerals, and a different point will be mainly described below.

Since the first and second transfer gates TG1 and TG2 are composed of the pass gate of FIG. 1(b), respectively, as illustrated in FIG. 8(a) to FIG. 8(c), in each of the first and second tunnel transistors T1 to T4, P-type source regions 24 to 27 and N-type drain regions 35 to 38 are disposed by being inverted in a B-direction as compared with FIG. 6(a) to FIG. 6(c).

Accordingly, the N-type drain regions 35 and 36 can be disposed near to the N-type drain regions 33 and 34, respectively. Further, in FIG. 8(c), the N-type drain regions 37 and 38 can be also disposed near to the N-type drain regions 33 and 34, respectively. Accordingly, a pattern of a mask used to an ion implantation for forming these impurity diffusion regions does not become complex.

In the second embodiment of FIGS. 6(a), 6(b), 6(c), 7(a), 7(b), and 7(c), since a potential of the P-type source region 24 to 27 of the first and second transfer gates TG1 and TG2 is stable in comparison with the third embodiment of FIG. 8(a) to FIG. 8(c) as described above, SRAM characteristics can be improved. However, since a design of an ion implantation is finer than the third embodiment of FIG. 8(a) to FIG. 8(c), an accuracy is required to patterning of the ion implantation and thus there is a possibility that a cost increases.

As explained in the first to third embodiments, in the tunnel transistor, since a semiconductor substrate cannot be electrically separated from a source region, it is necessary to isolate each tunnel transistor created on a silicon substrate. Accordingly, since the device separation region 2 is disposed between two diffusion regions electrically connected to each other, the contact plug of the diffusion regions cannot be shared.

In contrast, when an SOI substrate is used, since a semiconductor layer of the SOI substrate is separated with respect to each tunnel transistor, two diffusion regions electrically connected to each other can be formed integrally and the contact plug of the diffusion regions can be shared. An SRAM using the SOI substrate will be explained.

Fourth Embodiment

A fourth embodiment is different from the second embodiment in the point that an SRAM cell 5 is formed to an SOI substrate.

Figure 9:
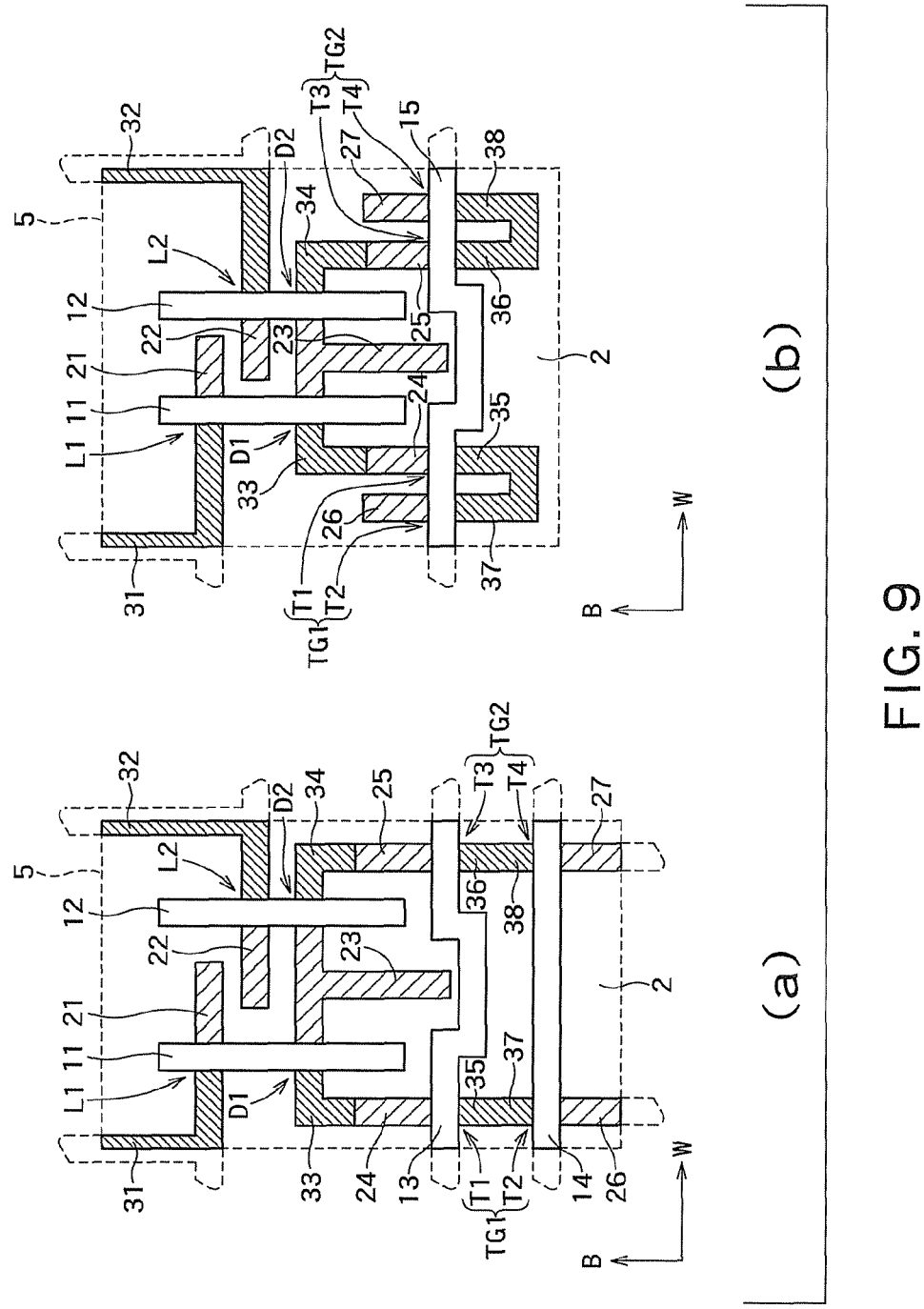
FIG. 9(a) and FIG. 9(b) are views briefly illustrating layouts of an SRAM cell according to a fourth embodiment.
Figure 10:
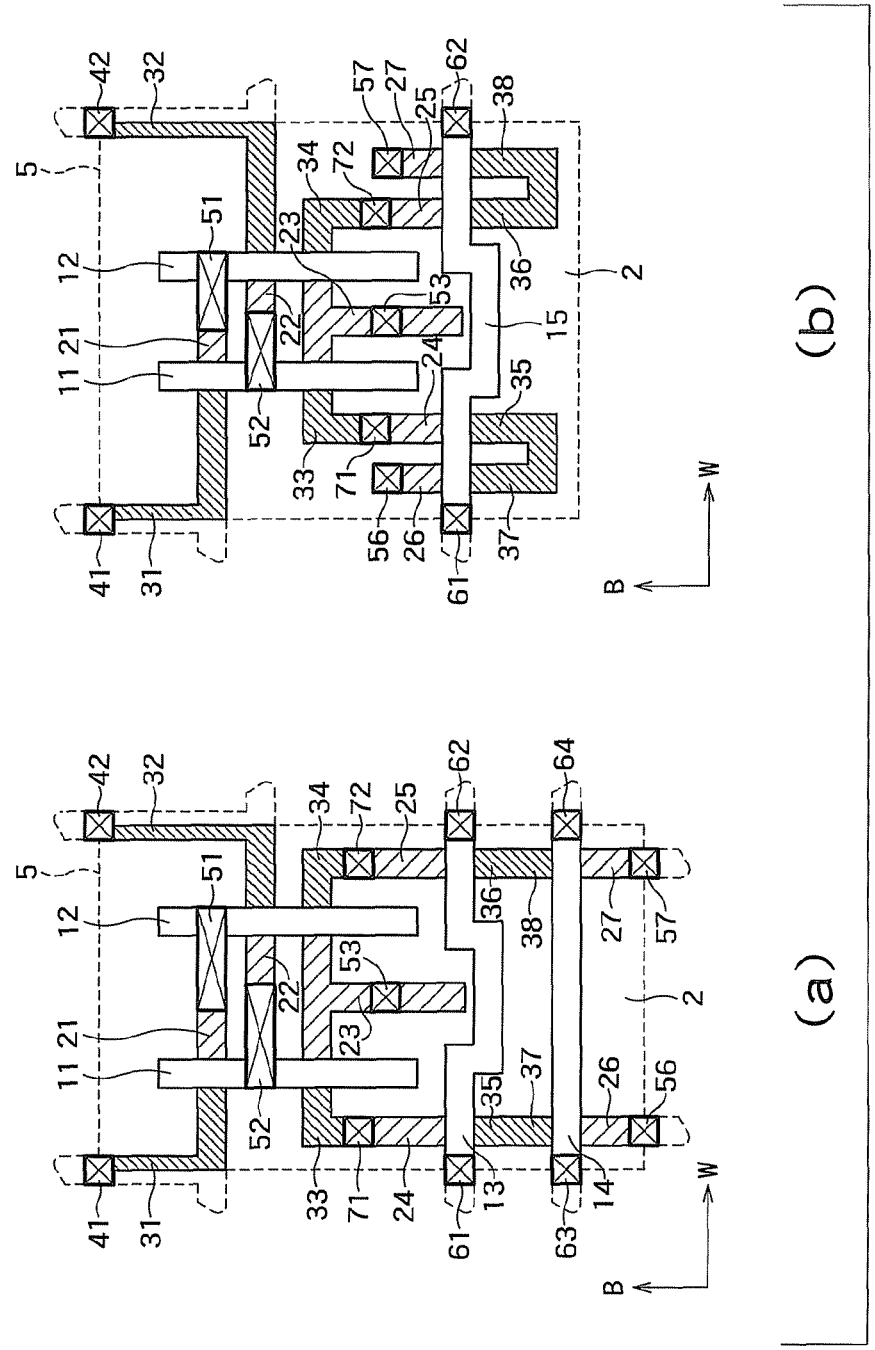
FIG. 10(a) and FIG. 10(b) are views where contact plugs are also illustrated to the layouts of FIG. 9(a) and FIG. 9(b), respectively.

FIG. 9(a) and FIG. 9(b) are views briefly illustrating layouts of the SRAM cell 5 according to the fourth embodiment. FIG. 9(a) and FIG. 9(b) are different from each other in layouts of first and second transfer gates TG1 and TG2, and correspond to FIG. 6(b) and FIG. 6(c), respectively. FIG. 10(a) and FIG. 10(b) are views where contact plugs are also illustrated to the layouts of FIG. 9(a) and FIG. 9(b), respectively. In FIG. 9(a) and FIG. 9(b), components which are common to those of FIG. 6(b) and FIG. 6(c) are denoted by the same reference numerals, and a different point will be mainly described below.

First, FIG. 9(a) and FIG. 10(a) will be explained. The SRAM cell 5 is formed to the SOI substrate. Accordingly, the fourth embodiment is different from the second embodiment in the following point.

In the first transfer gate TG1, N-type drain regions 35 and 37 of first and second tunnel transistors T1 and T2 are formed integrally. In the second transfer gate TG2, N-type drain region 36 and 38 of first and second tunnel transistors T3 and T4 are formed integrally.

Accordingly, as illustrated in FIG. 10(a), it is not necessary to connect contact plugs to the N-type drain regions 35 to 38.

Further, an N-type drain region 33 is in contact with a P-type source region 24. An N-type drain region 34 is in contact with a P-type source region 25. Accordingly, as illustrated in FIG. 10(a), a contact plug 71 is connected to a section where the N-type drain region 33 is in contact with the P-type source region 24. A contact plug 72 is connected to a section where the N-type drain region 34 is in contact with the P-type source region 25.

Accordingly, a cell size in a B-direction can be more reduced than that of FIG. 6(b), as well as a number of the contact plugs can be reduced.

Next, FIG. 9(b) and FIG. 10(b) will be explained.

Also in the examples, the N-type drain region 33 is in contact with the P-type source region 24. The N-type drain region 34 is in contact with the P-type source region 25. Accordingly, as illustrated in FIG. 10(b), the contact plug 71 is connected to the section where the N-type drain region 33 is in contact with P-type source region 24. The contact plug 72 is connected to the section where the N-type drain region 34 is in contact with the P-type source region 25.

Further, ends of the two N-type drain regions 35 and 37 of the first transfer gate TG1 disposed in parallel are formed integrally. Ends of the two N-type drain regions 36 and 38 of the second transfer gate TG2 disposed in parallel are formed integrally.

Accordingly, the cell size in the B-direction can be more reduced, as well as a number of the contact plugs can be reduced than that of FIG. 6(c).

As described above, when the SOI substrate is used, although the layouts can be made simpler as compared with FIG. 6(a) to FIG. 6(c) and FIG. 7(a) to FIG. 7(c), the SOI substrate is more expensive than a silicon substrate.

Fifth Embodiment

The fifth embodiment is different from the third embodiment in that an SRAM cell 5 is formed to an SOI substrate. That is, each of first and second transfer gates TG1 and TG2 is composed of the pass gate of FIG. 1(b) of the first embodiment.

Figure 11:
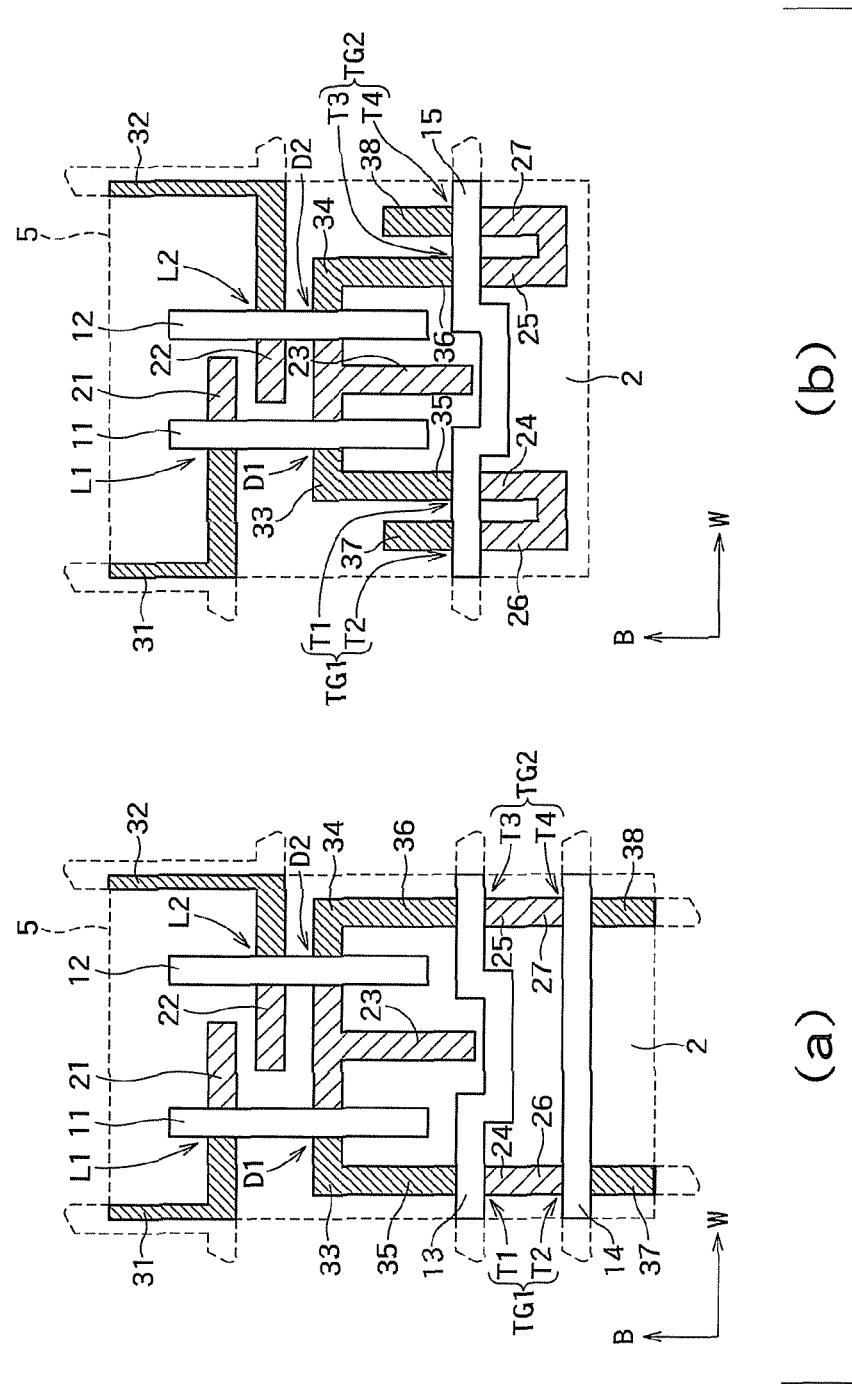
FIG. 11(a) and FIG. 11(b) are views briefly illustrating layouts of an SRAM cell according to a fifth embodiment.
Figure 12:
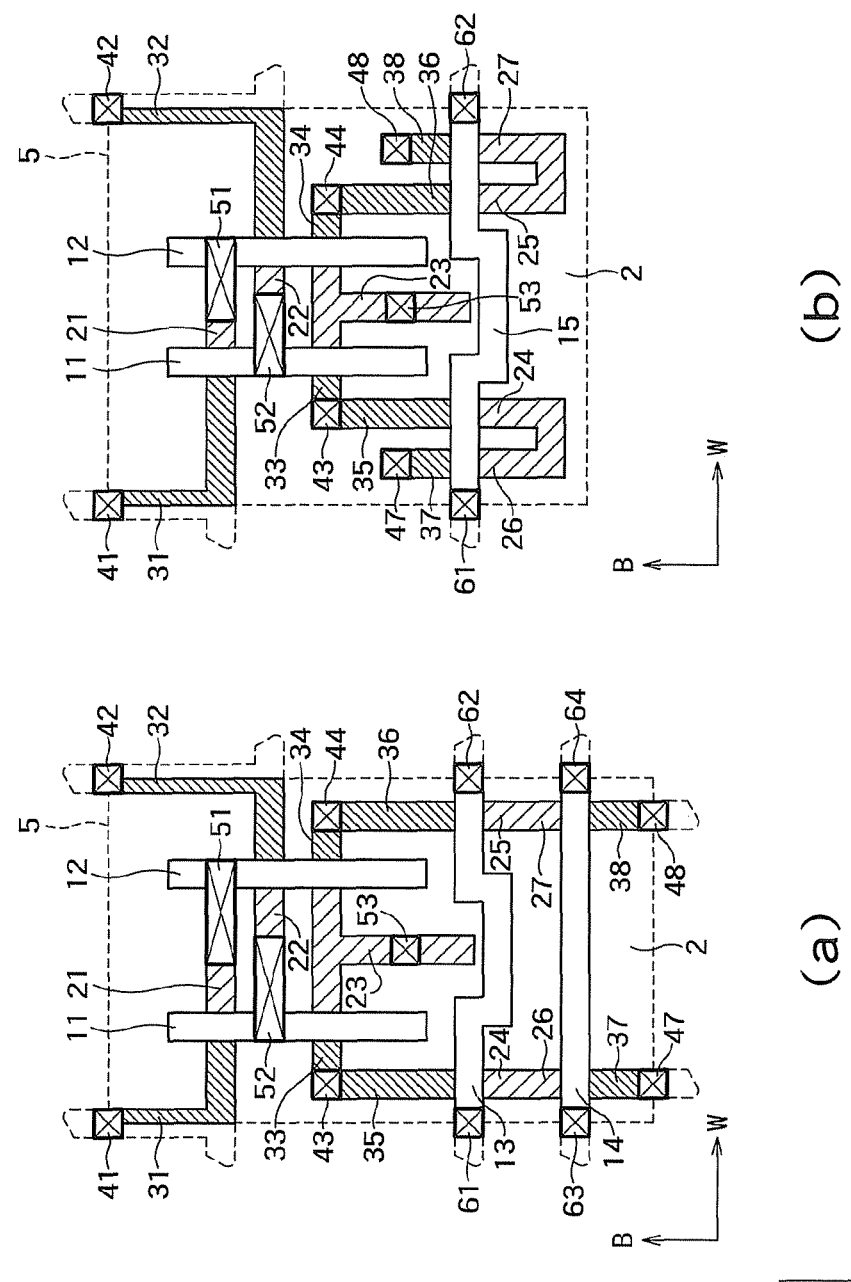
FIG. 12(a) and FIG. 12(b) are views where contact plugs are also illustrated to the layouts of FIG. 11(a) and FIG. 11(b).

FIG. 11(a) and FIG. 11(b) are views briefly illustrating layouts of the SRAM cell 5 according to the fifth embodiment. FIG. 11(a) and FIG. 11(b) are different from each other in layouts of the first and second transfer gates TG1 and TG2, and correspond to FIG. 8(b) and FIG. 8(c) of the third embodiment, respectively. FIG. 12(a) and FIG. 12(b) are views where contact plugs are also illustrated to the layouts of FIG. 11(a) and FIG. 11(b). In FIG. 11(a) and FIG. 11(b), components which are common to those of FIG. 8(b) and FIG. 8(c) are denoted by the same reference numerals, and a different point will be mainly described below.

First, FIG. 11(a) and FIG. 12(a) will be explained.

In the first transfer gate TG1, P-type source regions 24 and 26 of first and second tunnel transistors T1 and T2 are formed integrally. In the second transfer gate TG2, P-type source region 25 and 27 of first and second tunnel transistors T3 and T4 are formed integrally.

Accordingly, as illustrated in FIG. 12(a), it is not necessary to connect contact plugs to the P-type source regions 24 to 27.

Further, N-type drain regions 33 and 35 are formed integrally. N-type drain regions 34 and 36 are formed integrally. Accordingly, as illustrated in FIG. 12(a), a contact plug 43 is connected to the N-type drain regions 33 and 35 formed integrally. A contact plug 44 is connected to the N-type drain regions 34 and 36 formed integrally.

Accordingly, a cell size in a B-direction can be more reduced, as well as a number of the contact plugs can be reduced than that of FIG. 8(b).

Next, FIG. 11(b) and the FIG. 12(b) will be explained.

Also in the examples, the N-type drain regions 33 and 35 are formed integrally. The N-type drain regions 34 and 36 are formed integrally. Accordingly, as illustrated in FIG. 12(b), the contact plug 43 is connected to the N-type drain regions 33 and 35 formed integrally. The contact plug 44 is connected to the N-type drain regions 34 and 36 formed integrally.

Further, ends of the two P-type source regions 24 and 26 of the first transfer gate TG1 disposed in parallel are formed integrally. Ends of the two P-type source regions 25 and 27 of the second transfer gate TG2 disposed in parallel are formed integrally.

Accordingly, the cell size in the B-direction can be more reduced, as well as the number of the contact plugs can be reduced than that of FIG. 8(c).

According to at least one embodiment explained above, since the first and second tunnel transistors whose source regions or drain regions are electrically connected to each other are provided, there can be provided the pass gate using the tunnel transistor and configured to improve cut off characteristics and the semiconductor storage device including the pass gate.

Note that the pass gate explained in the first embodiment can be used to a device other than the SRAM. Further, the number of the transistors included in the SRAM cell 5 is not limited to 8 pieces. Further, the SRAM may be configured using the pass gate of the modification of the first embodiment of FIG. 3(a) and FIG. 3(b).

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor storage device, comprising:
an SRAM cell formed to a semiconductor layer,
the SRAM cell comprising:
first and second load transistors each comprising an N-type source region and a P-type drain region;
first and second driver transistors each comprising a P-type source region and an N-type drain region; and
first and second transfer gates each comprising a pass gate, and
each of the pass gate of the first transfer gate and the pass gate of the second transfer gate comprising:
a first tunnel transistor comprising a first conductivity type first diffusion region as a source or drain region, a second conductivity type second diffusion region as a drain or source region, and a gate electrode supplied with a control voltage; and
a second tunnel transistor connected to the first tunnel transistor in series, the second tunnel transistor comprising a first conductivity type first diffusion region as a source or drain region, a second conductivity type second diffusion region as a drain or source region electrically connected to the second diffusion region of the first tunnel transistor, and a gate electrode electrically connected to the gate electrode of the first tunnel transistor, wherein
the first and second load transistors, and the first and second driver transistors are tunnel transistors.

2. The semiconductor storage device according to claim 1, comprising:
a bit line connected to the first diffusion regions of the second tunnel transistors of the first and second transfer gates;
a word line connected to the gate electrodes of the first and second transfer gates, the word line intersecting the bit line;
a first shared gate electrode shared by the first load transistor and the first driver transistor; and
a second shared gate electrode shared by the second load transistor and the second driver transistor, wherein
the N-type source regions of the first and second load transistors are applied with a power supply voltage,
the P-type source regions of the first and second driver transistors are applied with a reference power supply voltage,
the second shared gate electrode, the P-type drain region of the first load transistor, the N-type drain region of the first driver transistor, and the first diffusion region of the first tunnel transistor of the first transfer gate are electrically connected to one another; and
the first shared gate electrode, the P-type drain region of the second load transistor, the N-type drain region of the second driver transistor, and the first diffusion region of the first tunnel transistor of the second transfer gate are electrically connected to one another.

3. The semiconductor storage device according to claim 1, wherein the N-type source regions of the first and second load transistors as well as the N-type drain regions of the first and second driver transistors are disposed in a region other than a region between any two of the P-type drain regions of the first and second load transistors as well as the P-type source regions of the first and second driver transistors.

4. The semiconductor storage device according to claim 1, wherein the first and second load transistors do not share one active region.

5. The semiconductor storage device according to claim 1, wherein each of the first and second load transistors shares an active region with a load transistor of other SRAM cell adjacent in a length direction of the word line of the SRAM cell.

6. The semiconductor storage device according to claim 1, comprising:
a first shared contact plug connected to the P-type drain region of the first load transistor and to a gate electrode of the second load transistor; and
a second shared contact plug connected to the P-type drain region of the second load transistor and to a gate electrode of the first load transistor.

7. The semiconductor storage device according to claim 1, wherein the four first diffusion regions of the first and second transfer gates are disposed in a region other than a region between any two of the four second diffusion regions of the first and second transfer gates.

8. The semiconductor storage device according to claim 7, wherein
the gate electrode of the first tunnel transistor of the first transfer gate and the gate electrode of the first tunnel transistor of the second transfer gate are formed integrally and configured as a third shared gate electrode extending in a length direction of the word line, and the gate electrode of the second tunnel transistor of the first transfer gate and the gate electrode of the second tunnel transistor of the second transfer gate are formed integrally and configured as a fourth shared gate electrode extending in a length direction of the word line.

9. The semiconductor storage device according to claim 7, wherein
in the first transfer gate, the first diffusion region of the first tunnel transistor, the second diffusion region of the first tunnel transistor, the second diffusion region of the second tunnel transistor, and the first diffusion region of the second tunnel transistor are disposed in this order along a length direction of the bit line, and
in the second transfer gate, the first diffusion region of the first tunnel transistor, the second diffusion region of the first tunnel transistor, the second diffusion region of the second tunnel transistor, and the first diffusion region of the second tunnel transistor are disposed in this order along a length direction of the bit line as well as in parallel with the first diffusion regions and the second diffusion regions of the first and second tunnel transistors of the first transfer gate.

10. The semiconductor storage device according to claim 9, wherein
in the first transfer gate, the second diffusion regions of the first and second tunnel transistors are formed integrally, and
in the second transfer gate, the second diffusion regions of the first and second tunnel transistors are formed integrally.

11. The semiconductor storage device according to claim 7, wherein
the gate electrodes of the first and second transfer gates are formed integrally and configured as a third shared gate electrode extending in a length direction of the word line,
the two first diffusion regions of the first transfer gate are disposed adjacent to each other across a device separation region as well as disposed on one side of the third shared gate electrode,
the two second diffusion regions of the first transfer gate are disposed adjacent to each other across the device separation region as well as disposed on the other side of the third shared gate electrode,
the two first diffusion regions of the second transfer gate are disposed adjacent to each other across the device separation region as well as disposed on the one side of the third shared gate electrode, and
the two second diffusion regions of the second transfer gate are disposed adjacent to each other across the device separation region as well as disposed on the other side of the third shared gate electrode.

12. The semiconductor storage device according to claim 11, wherein
ends of the two second diffusion regions of the first transfer gate are formed integrally, and
ends of the two second diffusion regions of the second transfer gate are formed integrally.

13. The semiconductor storage device according to claim 2, wherein
the first diffusion region is a P-type source region and the second diffusion region is an N-type drain region, and
at the time of read-out, the word line is supplied with a voltage higher than the power supply voltage.

14. A pass gate, comprising:
a first tunnel transistor comprising a first diffusion region of a first conductivity type as a source or drain region, a second diffusion region of a second conductivity type as a drain or source region, and a gate electrode supplied with a control voltage; and
a second tunnel transistor comprising a first diffusion region of the first conductivity type as a source or drain region, a second diffusion region of the second conductivity type as a drain or source region electrically connected to the second diffusion region of the first tunnel transistor, and a gate electrode electrically connected to the gate electrode of the first tunnel transistor, wherein
the first diffusion region is a P-type source region, and
the second diffusion region is an N-type drain region.

15. A pass gate comprising:
a first tunnel transistor comprising a first diffusion region of a first conductivity type as a source or drain region, a second diffusion region of a second conductivity type as a drain or source region, and a gate electrode supplied with a control voltage; and
a second tunnel transistor comprising a first diffusion region of the first conductivity type as a source or drain region, a second diffusion region of the second conductivity type as a drain or source region electrically connected to the second diffusion region of the first tunnel transistor, and a gate electrode electrically connected to the gate electrode of the first tunnel transistor, wherein
the first diffusion region is an N-type source region, and
the second diffusion region is a P-type drain region.

16. The pass gate according to claim 14, wherein
the first diffusion region and the second diffusion region are disposed in a surface of a semiconductor layer,
each of the first and second tunnel transistors comprises a gate insulation film disposed on a surface of the semiconductor layer between the first diffusion region and the second diffusion region, and
the gate electrode is disposed on the gate insulation film.

17. The pass gate according to claim 16, wherein the gate electrode is made of Si-type polycrystalline containing conductive impurities, metal or a laminated body of the Si-type polycrystalline and the metal.

18. The pass gate according to claim 15, wherein
the first diffusion region and the second diffusion region are disposed in a surface of a semiconductor layer,
each of the first and second tunnel transistors comprises a gate insulation film disposed on a surface of the semiconductor layer between the first diffusion region and the second diffusion region, and
the gate electrode is disposed on the gate insulation film.

19. The pass gate according to claim 18, wherein the gate electrode is made of Si-type polycrystalline containing conductive impurities, metal or a laminated body of the Si-type polycrystalline and the metal.

* * * * *